United States Patent
Saito et al.

(10) Patent No.: US 8,716,747 B2
(45) Date of Patent: May 6, 2014

(54) SEMICONDUCTOR DEVICE

(75) Inventors: Jun Saito, Nagoya (JP); Sachiko Aoi, Nagoya (JP); Takahide Sugiyama, Aichi-gun (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 269 days.

(21) Appl. No.: 13/366,896

(22) Filed: Feb. 6, 2012

(65) Prior Publication Data

US 2012/0132955 A1 May 31, 2012

Related U.S. Application Data

(63) Continuation of application No. PCT/JP2010/060945, filed on Jun. 28, 2010.

(30) Foreign Application Priority Data

Apr. 2, 2010 (JP) ................................. 2010-086148

(51) Int. Cl.
*H01L 29/66* (2006.01)

(52) U.S. Cl.
USPC ............... 257/140; 257/E29.197; 257/143; 257/146; 257/139; 257/E21.382; 257/E27.019; 257/E27.016

(58) Field of Classification Search
USPC ............... 257/140, E29.197, 143, 146, 139, 257/E21.382, E27.019, E27.016
See application file for complete search history.

(56) References Cited

U.S. PATENT DOCUMENTS

| | | | |
|---|---|---|---|
| 6,323,509 B1 | 11/2001 | Kusunoki | |
| 6,605,830 B1 | 8/2003 | Kusunoki | |
| 2009/0242931 A1* | 10/2009 | Tsuzuki et al. | ............... 257/143 |
| 2009/0278166 A1 | 11/2009 | Soeno et al. | |

FOREIGN PATENT DOCUMENTS

| | | |
|---|---|---|
| JP | 10-074959 A | 3/1998 |
| JP | 2000-200906 A | 7/2000 |
| JP | 2008-192737 A | 8/2008 |
| JP | 2009-267394 A | 11/2009 |
| JP | 2009-283781 A | 12/2009 |
| JP | 2010-067901 A | 3/2010 |

OTHER PUBLICATIONS

Translation of International Search Report mailed Sep. 21, 2010 of PCT/JP2010/060945.

* cited by examiner

*Primary Examiner* — Timor Karimy
(74) *Attorney, Agent, or Firm* — Kenyon & Kenyon LLP

(57) ABSTRACT

A diode region and an IGBT region are formed in a semiconductor layer of a semiconductor device. A lifetime controlled region is formed in the semiconductor layer. In a plan view, the lifetime controlled region has a first lifetime controlled region located in the diode region and a second lifetime controlled region located in a part of the IGBT region. The second lifetime controlled region extends from a boundary of the diode region and the IGBT region toward the IGBT region. In the plan view, a tip of the second lifetime controlled region is located in a forming area of the body region in the IGBT region.

4 Claims, 3 Drawing Sheets

SEMICONDUCTOR DEVICE

CROSS-REFERENCE TO RELATED APPLICATION

This is a Continuation of International Application No. PCT/JP2010/060945 filed on Jun. 28, 2010, which claims the benefit of Application No. 2010-086148 filed on Apr. 2, 2010 in Japan, the disclosure of which is hereby incorporated by reference herein in its entirety.

TECHNICAL FIELD

The present invention relates to a semiconductor device comprising a semiconductor layer in which a diode region and an IGBT (Insulated Gate Bipolar Transistor) region are formed herein.

DESCRIPTION OF RELATED ED ART

A semiconductor device in which a diode region and an IGBT region are formed in a semiconductor layer has been developed. In this type of the semiconductor device, the diode region is used as a Freewheeling Diode (FWD) such that a load current can reversely flow when the IGBT region is OFF. In this type of the semiconductor device, it is important to improve a reverse recovery characteristics of the diode region.

In Japanese Patent Application Publication No. 2009-267394 and Japanese Patent Application Publication No. 2008-192737, a technique for forming a lifetime controlled region in the semiconductor layer to improve the reverse recovery characteristics is proposed. The lifetime controlled region is formed to cause excess carriers, which have been injected when the load current was reversely flown, to disappear by recombination so that a reverse recovery charge (Qrr) in a reverse recovery time is reduced. In Japanese Patent Application Publication No. 2009-267394, a technique for forming the lifetime controlled region in both the diode region and the IGBT region is disclosed. In Japanese Patent Application Publication No. 2008-192737, a technique for selectively forming the lifetime controlled region only in the diode region is disclosed.

BRIEF SUMMARY OF INVENTION

As disclosed in Japanese Patent Application Publication No. 2009-267394, if a lifetime controlled region is formed across both a diode region and an IGBT region, then the part of the lifetime controlled region present in the IGBT region adversely decreases the transport efficiency of carriers when the IGBT region is turned ON. Consequently, the semiconductor device according to Japanese Patent Application Publication No. 2009-267394 has a problem that the ON voltage is large. On the other hand, as disclosed in Japanese Patent Application Publication No. 2008-192737, if the lifetime controlled region is formed only in the diode region, then an increase in the ON voltage is inhibited.

Nevertheless, the present inventors noted the following based on findings of a detailed investigation. In the IGBT region, a parasitic diode exists between a body region and a drift region. Consequently, when the load current returns, the parasitic diode is forward biased in the vicinity of the boundary between the diode region and the IGBT region and carriers may be adversely injected via the parasitic diode.

Consequently, as disclosed in Japanese Patent Application Publication No. 2008-192737, if the lifetime region is formed only in the diode region, then the carriers injected via the parasitic diode of the IGBT region cannot be eliminated satisfactorily. Consequently, as a result of the detailed investigation, the present inventors found that the reverse recovery charge (Qrr) increases owing to the carriers being injected via the parasitic diode of the IGBT region.

The art disclosed in the specification of the present application was created out of the abovementioned new findings, and it is an object of the present invention to improve the characteristics of both the ON voltage and the reverse recovery charge (Qrr).

A semiconductor device disclosed in the specification of the present application comprises a first lifetime controlled region, which, in a plan view, is positioned in a diode region, and a second lifetime controlled region, which, in the plan view, is positioned in a part of an IGBT region. The second lifetime controlled region extends from a boundary between the diode region and the IGBT region toward the IGBT region. More specifically, the second lifetime controlled region is formed such that, in the plan view, it overlaps a part of an area over which a body region of the IGBT region is formed. Thereby, at least some carriers injected via a parasitic diode of the IGBT region can be vanished by the second lifetime controlled region, and therefore an increase in a reverse recovery charge (Qrr) can be inhibited. In addition, the second lifetime controlled region is formed in a part of the IGBT region and not across an entire area thereof. Consequently, an increase in an ON voltage owing to the formation of the second lifetime controlled region is inhibited. According to the art disclosed in the present specification, a semiconductor device can be embodied wherein the characteristics of both the ON voltage and the reverse recovery charge (Qrr) are improved.

DETAILED DESCRIPTION OF INVENTION

Figure 1:
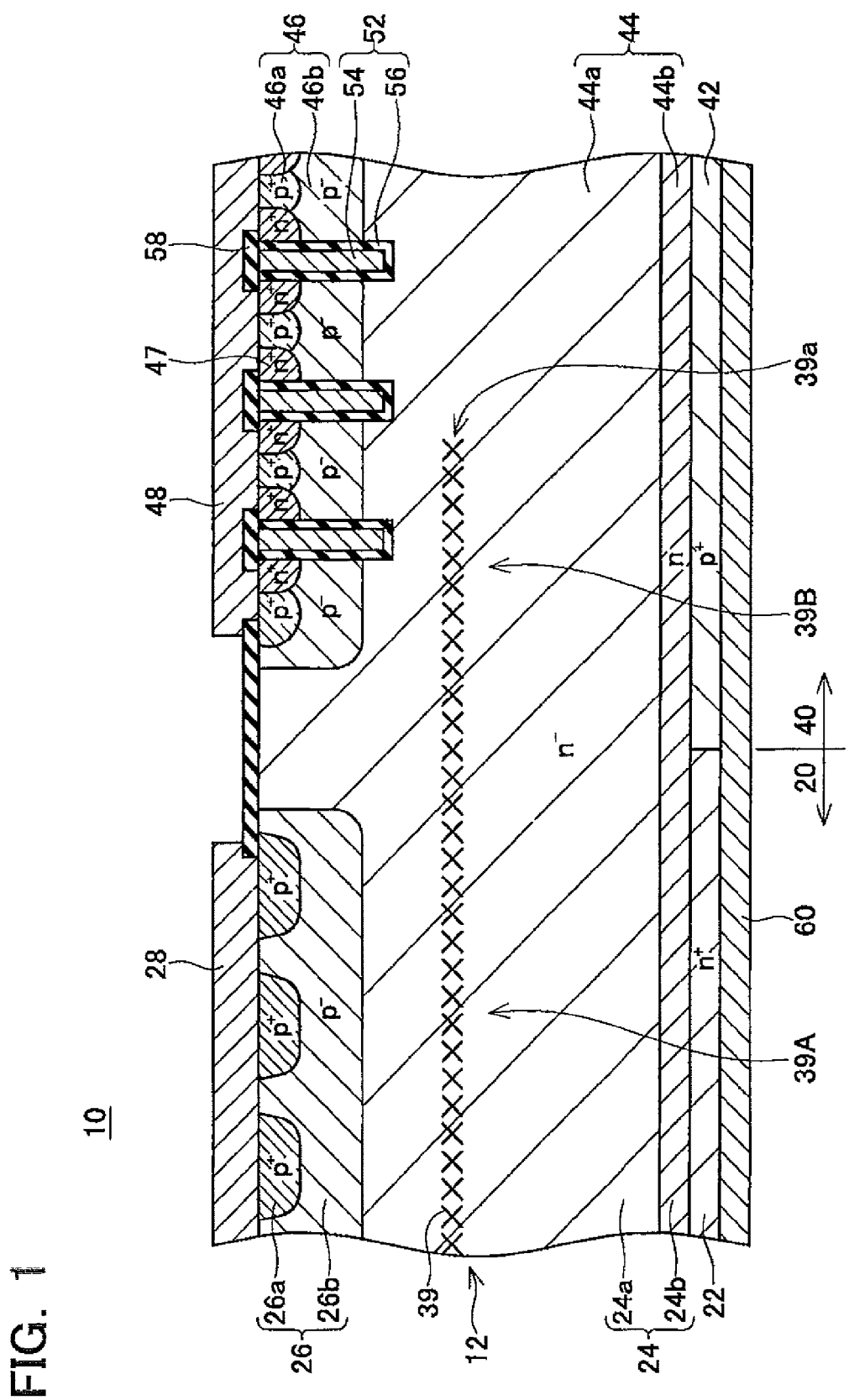
FIG. 1 schematically shows a cross sectional view of principal parts of a semiconductor device according to a first embodiment.

A semiconductor device disclosed in the present specification comprises a semiconductor layer wherein a diode region and an IGBT region are formed. The diode region comprises a p-type anode region, which is formed in a top surface portion of the semiconductor layer, and an n-type cathode region, which is formed in a bottom portion of the semiconductor layer. The IGBT region comprises a p-type body region, which is formed in the top surface portion of the semiconductor layer, and a p-type collector region, which is formed in the bottom portion of the semiconductor layer. Here, in the specification of the present application, an area over which the p-type collector region is formed in the bottom portion of the semiconductor layer is defined as the IGBT region. Accordingly, the boundary between the diode region and the IGBT region is the boundary between the area over which the collector region is formed and the area over which it is not. For example, it is often the case that the n-type cathode region of the diode region and the p-type collector region of the IGBT region are adjacent. Accordingly, the boundary between the diode region and the IGBT region may also be an interface between the cathode region and the collector region. A lifetime controlled region, which extends continuously in a horizontal direction of the semiconductor layer, is formed in the semiconductor layer. The lifetime controlled region is a region wherein a lifetime of carriers has been shortened more than in the surrounding region. For example, the lifetime controlled region is a region wherein a crystal defect has been formed deliberately. In the semiconductor device disclosed in the present specification, in a plan view, the lifetime controlled region comprises a first lifetime controlled region, which is positioned in the diode region, and a second lifetime controlled region, which is positioned in a part of the IGBT region. The second lifetime controlled region extends from the boundary between the diode region and the IGBT region toward the IGBT region. In the plan view, a tip of the second lifetime controlled region is positioned in the area over which the body region of the IGBT region is formed. Thus, if the second lifetime controlled region is formed below the body region of the IGBT region, then the probability that the carriers injected via the parasitic diode of the IGBT region will recombine in the second lifetime controlled region increases dramatically. As a result, an effect that the carriers injected via the parasitic diode have on a reverse recovery charge (Qrr) decreases.

In the semiconductor device disclosed in the specification of the present application, the tip of the second lifetime controlled region is preferably positioned within an area that is greater than or equal to a diffusion length of positive holes in the horizontal direction extending from the boundary between the diode region and the IGBT region. The diffusion length of the positive holes is estimated at approximately 60 µm. Accordingly, the tip of the second lifetime controlled region is preferably positioned within an area that is greater than or equal to 60 µm in the horizontal direction extending from the boundary between the diode region and the IGBT region. If the second lifetime controlled region extends 60 µm or more in the horizontal direction extending from the boundary between the diode region and the IGBT region, then the effect of reducing the reverse recovery charge (Qrr) can be obtained satisfactorily.

In the semiconductor device disclosed in the specification of the present application, a plurality of trench gates, which is provided such that the trench gates penetrate the body region, may be formed. In this case, in the plan view, the tip of the second lifetime controlled region is preferably positioned within an area that extends beyond the trench gate provided closest to the diode region. Here, the area that extends beyond that trench gate includes the area below that trench gate. The second lifetime controlled region in this case is formed over the entire area below the body region present on the diode region side of the trench gate provided closest to the diode region in the IGBT region. When a return current is flowing to the diode region, the parasitic diode, which is configured by the body region present on the diode region side of the trench gates, tends to be forward biased. Consequently, the second lifetime controlled region, which is formed with the abovementioned positional relationship, can satisfactorily vanish the carriers injected via the parasitic diode of the IGBT region.

In the semiconductor device disclosed in the specification of the present application, the tip of the second lifetime controlled region is preferably positioned within an area that is less than 500 µm in the horizontal direction extending from the boundary between the diode region and the IGBT region.

As a result of conducting an investigation, the present inventors ascertained that the effect of reducing the reverse recovery charge (Qrr) reaches saturation if the second lifetime controlled region is formed beyond 500 µm. Accordingly, taking the increase in the ON voltage into consideration, it is preferable to position the tip of the second lifetime controlled region within the abovementioned area. Thereby, a semiconductor device is embodied wherein the characteristics of both the ON voltage and the reverse recovery charge (Qrr) are improved.

In the semiconductor device disclosed in the specification of the present application, the lifetime controlled region is formed by the irradiation of charged particles and preferably is formed in a part of a plane at a prescribed depth of the semiconductor layer.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor device, as well as methods for using and manufacturing the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

As shown in FIG. 1, a semiconductor device 10 comprises a semiconductor layer 12 wherein a diode region 20 and an IGBT region 40 coexist. In the semiconductor device 10, the diode region 20 is used as a freewheeling diode; furthermore, when the IGBT region 40 is OFF, a load current is caused to return. For example, the IGBT region 40 may be formed such that, in the plan view, it completely surrounds the diode region 20. Alternatively, the diode region 20 and the IGBT region 40 may be formed such that, in the plan view, they are arrayed adjacently in one direction.

The semiconductor device 10 comprises: a common electrode 60, which is formed in a rear surface of the semiconductor layer 12; and an anode 28 and an emitter electrode 48, which are formed in a front surface of the semiconductor layer 12. The common electrode 60 is formed across both the diode region 20 and the IGBT region 40; furthermore, the common electrode 60 is a cathode in the diode and a collector electrode in the IGBT. The anode 28 is formed such that it corresponds to the diode region 20. The emitter electrode 48 is formed such that it corresponds to the IGBT region 40. Furthermore, as needed, the anode 28 and the emitter electrode 48 may be a single common electrode.

In a region corresponding to the diode region 20 of the semiconductor layer 12, the semiconductor device 10 further comprises an n-type cathode region 22, an n-type intermediate region 24, and a p-type anode region 26.

The cathode region 22 is formed in the rear layer part of the semiconductor layer 12 using, for example, the ion implantation technology. The impurity concentration of the cathode region 22 is high, and the cathode region 22 ohmically contacts the common electrode 60.

The intermediate region 24 is provided between the cathode region 22 and the anode region 26. The intermediate region 24 comprises a low concentration intermediate region 24a and a buffer region 24b. The low concentration intermediate region 24a and the buffer region 24b have different impurity concentrations, namely, the impurity concentration of the low concentration intermediate region 24a is lower than that of the buffer region 24b. The low concentration intermediate region 24a is the remaining part of the semiconductor layer 12 wherein other regions are formed. The impurity concentration of the low concentration intermediate region 24a is constant in the thickness direction; furthermore, the buffer region 24b is formed using, for example, the ion implantation technology.

The anode region 26 is formed in the front layer part of the semiconductor layer 12 using, for example, the ion implantation technology. The anode region 26 comprises: a plurality of high concentration anode regions 26a; and a low concentration anode region 26b, which surrounds the plurality of the high concentration anode regions 26a. The high concentration anode regions 26a are disposed such that they are dispersed within the front layer part of the semiconductor layer 12. The impurity concentration of the high concentration anode regions 26a is high, and the high concentration anode regions 26a ohmically contact the anode 28. The impurity concentration of the low concentration anode region 26b is lower than that of the high concentration anode regions 26a. A position of a lower end of the anode region 26 is shallower than a position of lower ends of trench gates 52, which are discussed below. As an alternative to the present example, the low concentration anode region 26b may be provided only between adjacent high concentration anode regions 26a. Various configurations of the anode region 26 can be adopted in accordance with the characteristics desired for the diode region 20.

At the region corresponding to the IGBT region 40 of the semiconductor layer 12, the semiconductor device 10 further comprises a p-type collector region 42, an n-type drift region 44, a p-type body region 46, and n-type emitter regions 47.

The collector region 42 is formed in the rear layer part of the semiconductor layer 12 using, for example, the ion implantation technology. The impurity concentration of the collector region 42 is high, and the collector region 42 ohmically contacts the common electrode 60. The collector region 42 of the IGBT region 40 and the cathode region 22 of the diode region 20 are positioned at substantially the same depth in the semiconductor layer 12 and are adjacent in the horizontal direction of the semiconductor layer 12. In the present example, the interface between the collector region 42 and the cathode region 22 is the boundary between the diode region 20 and the IGBT region 40.

The drift region 44 is provided between the collector region 42 and the body region 46. The drift region 44 comprises a low concentration drift region 44a and a buffer region 44b.

The low concentration drift region 44a and the buffer region 44b have different impurity concentrations, namely, the impurity concentration of the low concentration drift region 44a is lower than that of the buffer region 44b. The low concentration drift region 44a is the remaining part of the semiconductor layer 12 wherein other regions are formed; furthermore, the impurity concentration of the low concentration drift region 44a is constant in the thickness direction. The buffer region 44b is formed using, for example, the ion implantation technology.

The body region 46 is formed in the front layer part of the semiconductor layer 12 using, for example, the ion implantation technology. The body region 46 comprises a plurality of body contact regions 46a; and a low concentration body region 46b, which surrounds the body contact regions 46a. The body contact regions 46a are disposed such that they are dispersed within the front layer part of the semiconductor layer 12. The impurity concentration of the plurality of the body contact regions 46a is high; furthermore, the body contact regions 46a ohmically contact the emitter electrode 48. The impurity concentration of the low concentration body region 46b is lower than that of the plurality of the body contact regions 46a.

The plurality of the emitter regions 47 is formed in the front layer part of the semiconductor layer 12 using, for example, the ion implantation technology. The emitter regions 47 are disposed such that they are dispersed within the front layer part of the semiconductor layer 12. The impurity concentration of the emitter regions 47 is high, and the emitter regions 47 ohmically contact the emitter electrode 48.

The semiconductor device 10 further comprises the plurality of the trench gates 52, which is formed in the region corresponding to the IGBT region 40. The trench gates 52 are disposed such that they are dispersed within the front layer part of the semiconductor layer 12. Each of the trench gates 52 comprises a trench gate electrode 54 and a gate insulating film 56, which covers the trench gate electrode 54. Each of the trench gates 52 extends from the front surface toward the rear surface of the semiconductor layer 12 and penetrates the body region 46. Each of the trench gates 52 is connected to the corresponding emitter region 47, the low concentration body region 46b, and the low concentration drift region 44a. Each of the trench gate electrodes 54 is insulated from the emitter electrode 48 by an insulating film 58.

The semiconductor device 10 further comprises a lifetime controlled region 39, which is formed at a prescribed depth in the semiconductor layer 12. The lifetime controlled region 39 is formed in a part of the plane at the prescribed depth in the semiconductor layer 12. The lifetime controlled region 39 comprises a first lifetime controlled region 39A, which, in the plan view, is formed continuously along the horizontal direction over the entire area of the diode region 20. The lifetime controlled region 39 further comprises a second lifetime controlled region 39B, which, in the plan view, is formed continuously along the horizontal direction in a part of the IGBT region 40. The first lifetime controlled region 39A of the diode region 20 and the second lifetime controlled region 39B of the IGBT region 40 are continuous at the boundary between the diode region 20 and the IGBT region 40. The second lifetime controlled region 39B of the IGBT region 40 extends from the boundary between the diode region 20 and the IGBT region 40 toward the interior of the IGBT region 40. In greater detail, a tip 39a of the second lifetime controlled region 39l3 is positioned, in the plan view, within the area over which the body region 46 of the IGBT region 40 is formed. In addition, the tip 39a of the second lifetime controlled region 39B is positioned, in the plan view, within the area of the IGBT region 40 beyond the body contact region 46a closest to the diode region 20. Furthermore, the tip 39a of the second lifetime controlled region 39B is positioned, in the plan view, within the area of the IGBT region 40 beyond the trench gate 52 closest to the diode region 20.

In the diode region 20, the lifetime controlled region 39 is formed in the low concentration intermediate region 24a; furthermore, in the IGBT region 40, the lifetime controlled region 39 is formed in the low concentration drift region 44a. More specifically, the first lifetime controlled region 39A of the diode region 20 is formed on the low concentration intermediate region 24a side of the interface between the low concentration intermediate region 24a and the low concentration anode region 26b. The second lifetime controlled region 39B of the IGBT region 40 is formed on the low concentration drift region 44a side of the interface between the low concentration drift region 44a and the low concentration body region 46b.

The lifetime controlled region 39 can be formed using any of various well known techniques. In the present embodiment, the lifetime controlled region 39 is formed at the prescribed depth by the irradiation of helium (He) to the semiconductor layer 12. As an alternative to the present example, the lifetime controlled region 39 may be formed by an irradiation of other charged particles to the semiconductor layer 12. Alternatively, the lifetime controlled region 39 may be formed by the irradiation of an electron beam to the semiconductor layer 12. In addition, the lifetime controlled region 39 may be formed by a diffusion of a heavy metal, such as gold or platinum, into the semiconductor layer 12.

The lifetime controlled region 39 includes a much larger quantity of crystal defects than the surrounding region does owing to damage that resulted from the irradiation of the helium. The crystal defect density of the lifetime controlled region 39 peaks at the prescribed depth in the semiconductor layer 12 and is higher than the crystal defect density of the surrounding low concentration intermediate region 24a and low concentration drift region 44a. Consequently, the lifetime controlled region 39 can serve as a location where electrons and positive holes recombine.

Next, characteristics related to the reverse recovery characteristic of the semiconductor device 10 will be explained. The semiconductor device 10 is used as one of six transistors that constitute a vehicle onboard three-phase inverter circuit and is connected to an AC motor (not shown). The semiconductor device 10 is controlled, namely, turned ON and OFF, using pulse width modulation (PWM); when the IGBT region 40 is OFF, the return current flows toward the AC motor via the diode region 20. At this time, the diode region 20 is in a forward biased state, the anode 28 is at a high potential, and the common electrode 60 is at a low potential. Consequently, a large quantity of positive holes from the anode region 26 is injected toward the low concentration intermediate region 24a.

Next, if the diode region 20 transitions to a reverse biased state, then the return current is cut off. At this time, the anode 28 of the diode region 20 is at a low potential and the common electrode 60 is at a high potential. Consequently, if the diode region 20 transitions to the reverse biased state, then the positive holes that were being injected by the return current to the low concentration intermediate region 24a begin to flow in the reverse direction toward the anode region 26. This phenomenon is observed as a reverse recovery current. The product of the size and the duration of this reverse recovery current is the reverse recovery charge (Qrr), and reducing the reverse recovery charge (Qrr) is critical for also reducing power loss.

To reduce the reverse recovery charge (Qrr), it is essential to reduce the quantity of positive holes that are injected when the return current flows. In the semiconductor device 10, the first lifetime controlled region 39A is formed over the entire area of the diode region 20. The first lifetime controlled region 39A has crystal defects, and therefore functions as the recombination center of the carrier. Consequently, in the diode region 20, excess positive holes injected by the return current vanish owing to recombination in the first lifetime controlled region 39A.

As described above, when the return current flows, the anode 28 is at the high potential and the common electrode 60 is at the low potential. In the semiconductor device 10, the anode 28 and the emitter electrode 48 are used such that they are short circuited; therefore, when the anode 28 is at a high potential, the emitter electrode 48 is also at a high potential. As shown in FIG. 1, in the IGBT region 40, a parasitic diode exists between the body region 46 and the drift region 44. The majority of this parasitic diode does not operate because the p-type collector region 42 is provided in the rear layer part. Nevertheless, it was found that the parasitic diode that exists in the vicinity of the boundary between the diode region 20 and the IGBT region 40 does operate when the forward voltage of the diode region 20 increases. In particular, if the crystal defect density of the lifetime controlled region 39 is increased, then the forward voltage of the diode region 20 increases when the return current flows. Consequently, it was found that the parasitic diode that exists in the vicinity of the boundary between the diode region 20 and the IGBT region 40 is forward biased.

In the semiconductor device 10, corrective action is taken also with respect to the parasitic diode that exists in the vicinity of this boundary. As shown in FIG. 1, in the semiconductor device 10, the second lifetime controlled region 39B is formed in a part of the IGBT region 40. Consequently, positive holes injected via the parasitic diode of the IGBT region 40 are vanished by recombination in the second lifetime controlled region 39B. Consequently, in the semiconductor device 10, the positive holes injected via the parasitic diode of the IGBT region 40 inhibit an increase in the reverse recovery charge (Qrr).

Figure 2:
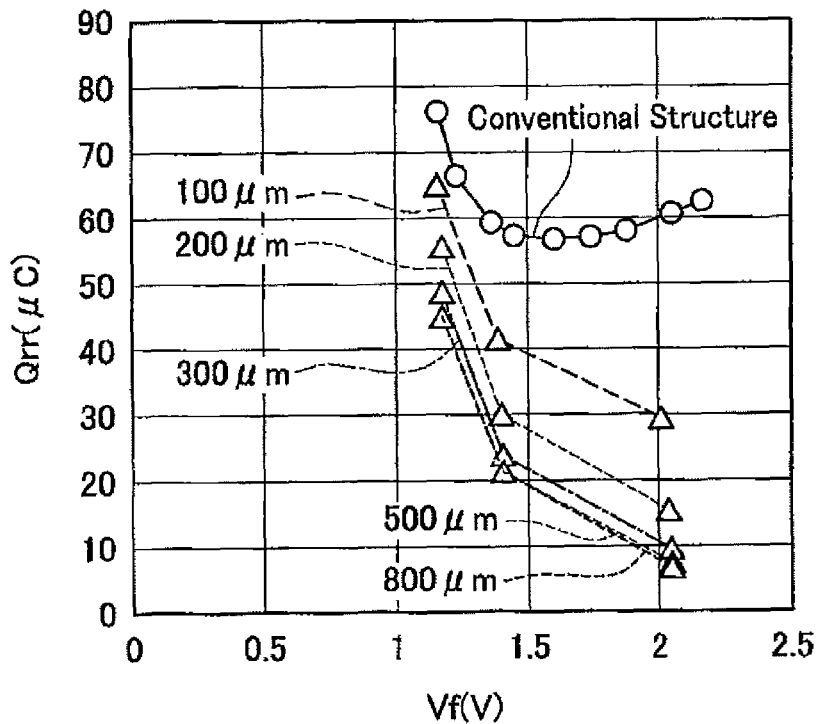
FIG. 2 shows a relationship between a forward voltage and a reverse recovery charge (Qrr) of a diode region.

FIG. 2 shows the relationship between the forward voltage (Vf) impressed on the diode region 20 and the reverse recovery charge (Qrr). The larger the forward voltage (Vf), the greater the number of crystal defects included in the lifetime controlled region 39, with greater numbers indicating larger amounts of helium having been irradiated to form the lifetime controlled region 39. The conventional structure in the figure represents one example wherein the lifetime controlled region 39 is formed only in the diode region 20 and not in the IGBT region 40. In the figure, 100, 200, 300, 500, and 800 μm each indicate the length with which the second lifetime controlled region 39B extends from the boundary between the diode region 20 and the IGBT region 40 toward the interior of the IGBT region 40.

Normally, the larger the forward voltage (Vf), the greater the quantity of crystal defects of the lifetime controlled region 39, and therefore the lower the reverse recovery charge (Qrr). Nevertheless, as shown in FIG. 2, in the conventional structure, if the forward voltage (Vf) increases beyond approximately 1.5 V, then the reverse recovery charge (Qrr) increases. It is conjectured that this phenomenon is caused by the increase in the forward voltage (Vf), which forward biases the parasitic diode of the IGBT region 40, thereby injecting positive holes via that parasitic diode.

Moreover, in the present embodiment, for every case in which the second lifetime controlled region 39B is formed in a part of the IGBT region 40, it was found that the reverse recovery charge (Qrr) decreases more than in the conventional structure. In particular, in relation to the range wherein the forward voltage (Vf) exceeds approximately 1.5 V, the reverse recovery charge (Qrr) decreases for every case in the present embodiment, as opposed to increasing as in the conventional structure. This shows that forming the second lifetime controlled region 39B in a part of the IGBT region 40 makes it possible to satisfactorily vanish the positive holes injected via the parasitic diode of the IGBT region 40 and thereby to prevent an increase in the reverse recovery charge (Qrr).

Figure 3:
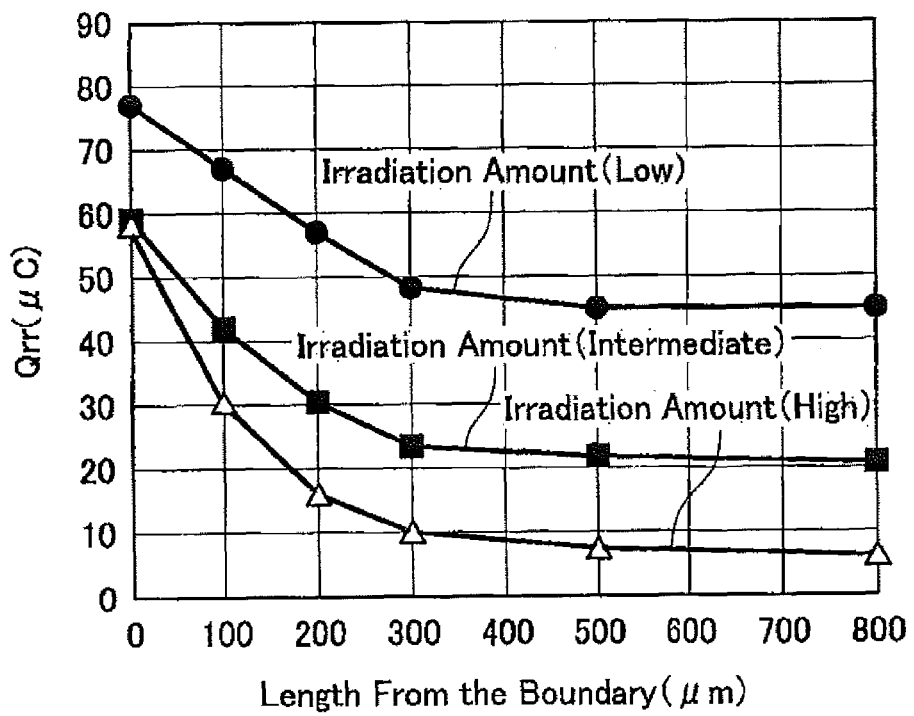
FIG. 3 shows a relationship between the reverse recovery charge (Qrr) and a length extending from a boundary between the diode region and an IGBT region.

FIG. 3 shows the relationship between the reverse recovery charge (Qrr) and the length with which the lifetime controlled region 39 extends from the boundary between the diode region 20 and the IGBT region 40 toward the IGBT region 40. Regardless of the amount of helium that was irradiated to form the lifetime controlled region 39, it was verified for every example, that, if the length extending from the boundary exceeds 500 µm, then the effect of reducing the reverse recovery charge (Qrr) becomes saturated.

As described above, in the semiconductor device 10, forming the second lifetime controlled region 39B in a part of the IGBT region 40 makes it possible for the second lifetime controlled region 39B formed in the IGBT region 40 to vanish at least some of the positive holes injected via the parasitic diode of the IGBT region 40. Thereby, it is possible to inhibit an increase in the reverse recovery charge (Qrr). In addition, the second lifetime controlled region 39B is formed in a part, but not over the entire area, of the IGBT region 40. Consequently, an increase in the ON voltage owing to the formation of the second lifetime controlled region 39B is also inhibited. In the semiconductor device 10, the characteristics of both the ON voltage and the reverse recovery charge (Qrr) are improved.

Second Embodiment

Figure 4:
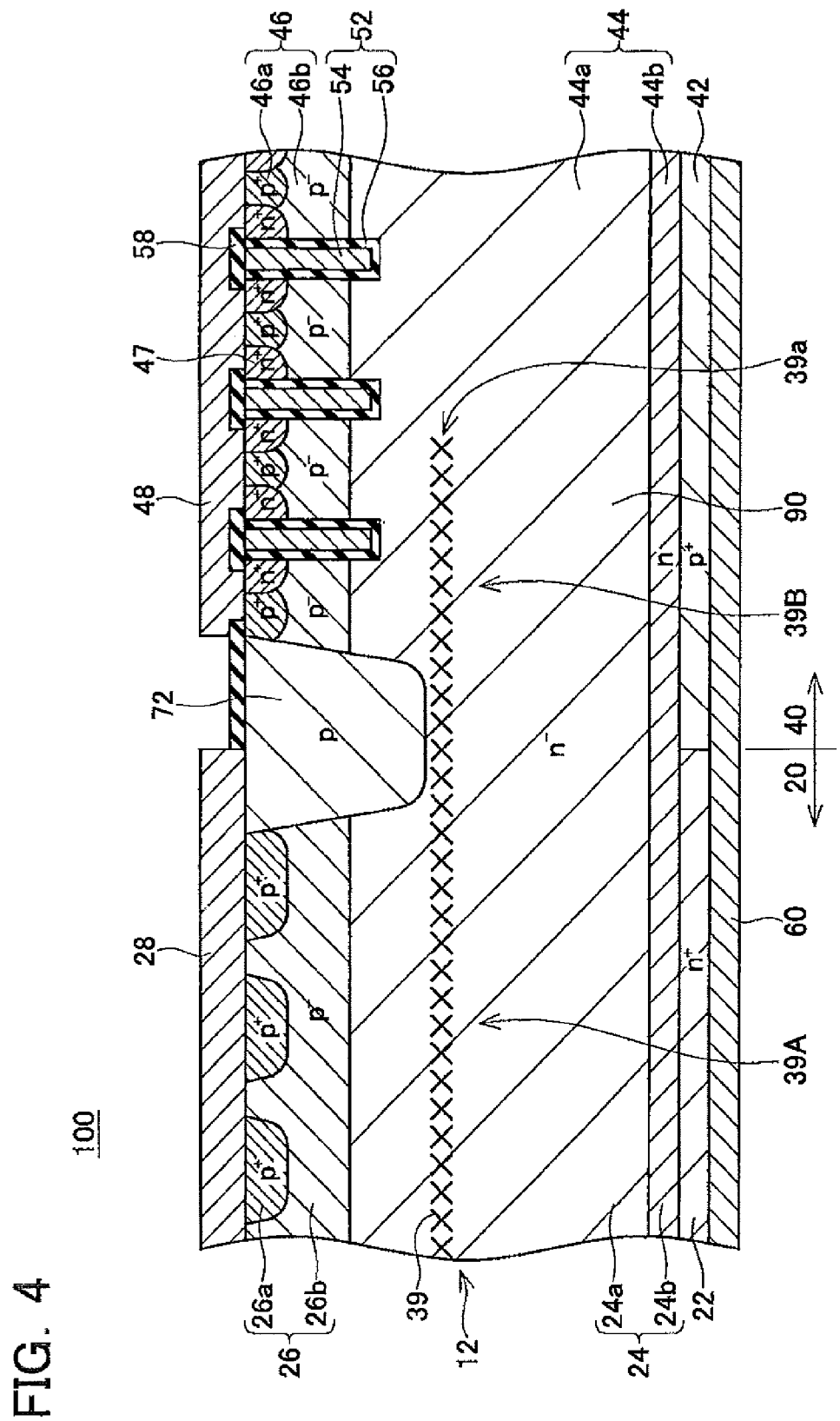
FIG. 4 schematically shows a cross sectional view of principal parts of a semiconductor device according to a second embodiment.

As shown in FIG. 4, in a semiconductor device 100, a p-type isolation region 72 is formed in the vicinity of the boundary between the diode region 20 and the IGBT region 40. The isolation region 72 is formed in the front layer part of the semiconductor layer 12. The isolation region 72 is formed deeper than the lower end of the anode region 26 and the lower end of the body region 46. In greater detail, the isolation region 72 is formed deeper than the lower ends of the trench gates with respect to the upper surface of the semiconductor layer 12. In addition, the isolation region 72 contacts both the anode region 26 and the body region 46. The impurity concentration of the isolation region 72 is higher than those of the low concentration anode region 26b and the low concentration body region 46b. When the IGBT region 40 is OFF, the isolation region 72 extends a depletion layer toward the low concentration intermediate region 24a and the low concentration drift region 44a and thereby inhibits the electric field in the vicinity of the boundary between the diode region 20 and the IGBT region 40 to concentrate. In particular, because the isolation region 72 is formed deeper than the trench gates, the electric field in the trench gates in the vicinity of the isolation region 72 is inhibited from being concentrated.

In the semiconductor device 100, the lifetime controlled region 39 is also formed at the lower end of the isolation region 72. The isolation region 72 also constitutes a parasitic diode. Consequently, in the semiconductor device that comprises the isolation region 72, forward biasing the parasitic diode of the isolation region 72 will lead to an increase in the reverse recovery charge (Qrr). In the semiconductor device 100, because the lifetime controlled region 39 is also formed at the lower end of the isolation region 72, the positive holes injected via the parasitic diode of the isolation region 72 can be vanished satisfactorily. Furthermore, as in the first embodiment, because the second lifetime controlled region 39B is formed below the body region 46 of the IGBT 40, the positive holes injected via the parasitic diode of the body region 46 can be vanished satisfactorily.

Specific examples of the present invention are described above in detail, but these examples are merely illustrative and place no limitation on the scope of the patent claims. The technology described in the patent claims also encompasses various changes and modifications to the specific examples described above.

The technical elements explained in the present specification or drawings provide technical utility either independently or through various combinations. The present invention is not limited to the combinations described at the time the claims are filed. Further, the purpose of the examples illustrated by the present specification or drawings is to satisfy multiple objectives simultaneously, and satisfying any one of those objectives gives technical utility to the present invention.

What is claimed is:

1. A semiconductor device comprising:
a semiconductor layer in which a diode region and an IGBT region are formed, wherein,
the diode region includes a p-type anode region formed in a top surface portion of the semiconductor layer and an n-type cathode region formed in a bottom portion of the semiconductor layer,
the IGBT region includes a p-type body region formed in the top surface portion of the semiconductor layer and a p-type collector region formed in the bottom portion of the semiconductor layer,
a lifetime controlled region is formed in the semiconductor layer such that the lifetime controlled region continuously extends along a lateral direction of the semiconductor layer,
in a plan view, the lifetime controlled region has a first lifetime controlled region located in the diode region and a second lifetime controlled region located in a part of the IGBT region,
the second lifetime controlled region extends from a boundary of the diode region and the IGBT region toward the IGBT region, wherein a tip of the second lifetime controlled region is located in an area that is equal to or more than 60 µm from the boundary along the lateral direction, and
in the plan view, the tip of the second lifetime controlled region is located in a forming area of the body region in the IGBT region.

2. The semiconductor device according to claim 1, wherein the tip of the second lifetime controlled region is located in an area that is equal to or less than 500 µm from the boundary along the lateral direction.

3. A semiconductor device comprising:
a semiconductor layer in which a diode region and an IGBT region are formed, wherein,
the diode region includes a p-type anode region formed in a top surface portion of the semiconductor layer and an n-type cathode region formed in a bottom portion of the semiconductor layer,
the IGBT region includes a p-type body region formed in the top surface portion of the semiconductor layer and a p-type collector region formed in the bottom portion of the semiconductor layer, a lifetime controlled region is formed in the semiconductor layer such that the lifetime controlled region continuously extends along a lateral direction of the semiconductor layer, in a plan view, the lifetime controlled region has a first lifetime controlled region located in the diode region and a second lifetime controlled region located in a part of the IGBT region, the second lifetime controlled region extends from a boundary of the diode region and the IGBT region toward the IGBT region, and in the plan view, a tip of the second lifetime controlled region is located in a forming area of the body region in the IGBT region;

wherein a plurality of trench gates is formed to penetrate the body region, and in the plan view, the tip of the second lifetime controlled region is located in an area that is beyond the trench gate that is closest to the diode region.

4. The semiconductor device according to claim 3, wherein the tip of the second lifetime controlled region is located in an area that is equal to or less than 500 μm from the boundary along the lateral direction.

* * * * *